US006628135B2

(12) United States Patent
Gauthier et al.

(10) Patent No.: US 6,628,135 B2
(45) Date of Patent: Sep. 30, 2003

(54) ANALOG-BASED ON-CHIP VOLTAGE SENSOR

(75) Inventors: Claude R. Gauthier, Fremont, CA (US); Brian W. Amick, Austin, TX (US); Spencer Gold, Pepperell, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/954,883

(22) Filed: Sep. 18, 2001

(65) Prior Publication Data

US 2003/0052331 A1 Mar. 20, 2003

(51) Int. Cl.[7] ........................ G01R 31/02; G01R 31/26; G05F 5/00
(52) U.S. Cl. .................. 324/763; 324/765; 324/158.1; 323/313; 365/189.09
(58) Field of Search ................. 324/763, 765, 324/158.1, 98, 760, 76.13; 365/189.09; 323/313

(56) References Cited

U.S. PATENT DOCUMENTS

| 3,490,041 | A | * | 1/1970 | Shapiro et al. ............... 324/98 |
| 3,879,662 | A | * | 4/1975 | Barneck ....................... 324/98 |
| 5,291,121 | A | * | 3/1994 | Neale et al. .................. 323/313 |
| 6,407,627 | B1 | * | 6/2002 | Martin ......................... 327/552 |
| 6,448,798 | B1 | * | 9/2002 | Shinmori ..................... 324/763 |

* cited by examiner

*Primary Examiner*—Kamand Cuneo
*Assistant Examiner*—Paresh Patel
(74) *Attorney, Agent, or Firm*—Rosenthal & Osha L.L.P.

(57) ABSTRACT

An on-chip voltage sensor that selectively eliminates noise from a voltage measurement is provided. The on-chip voltage sensor has resistive and capacitive components in the voltage divider, thus allowing a voltage on a section of a computer chip to be measured exclusive of high-frequency noise. Further, a method for measuring a voltage on a section of a computer chip using a voltage divider having a resistor and a capacitor is provided. Further, a computer chip having an on-chip voltage sensor is provided. Further, a method and apparatus for observing voltages at multiple locations on an integrated circuit.

11 Claims, 2 Drawing Sheets

ANALOG-BASED ON-CHIP VOLTAGE SENSOR

BACKGROUND OF INVENTION

The performance of a computer chip (also referred to and known as "integrated circuit") varies with the voltages, temperatures, and process comers at different points on the computer chip. Accurately knowing these parameters helps chip designers understand and improve chip behavior.

For example, if a voltage supply level for a clock tree is low, the clock tree loses its drive strength, and the integrity of clock signals throughout a computer chip may deteriorate. Thus, it is important to know voltages at particular points on the computer chip to ensure that performance inhibiting behavior is compensated for and/or avoided in chip design.

One approach used by chip designers to monitor voltage on a computer chip involves the allocation of sense points on the computer chip. These sense points are then attached to a trace, or wire, that leads to an exterior area, such as the circuit board, of the computer chip. However, this type of voltage measurement is prone to inaccuracy because the measurement of the voltage on the chip attenuates as the measurement transfers to an area outside the computer chip. Further, such a measurement technique is costly because multiple wires have to be brought out from the computer chip when voltages at multiple locations need to be determined.

Alternatively, chip designers can physically probe different regions within the computer chip. However, this technique is becoming increasingly difficult because empty space within a computer chip is decreasing as modern computer chips become smaller and more device-laden. In cases when physical probing is not feasible, voltage is assumed to be within a certain range.

SUMMARY OF INVENTION

According to one aspect of the present invention, an on-chip voltage monitor that filters out high-frequency noise in a voltage measurement comprises a divider stage comprising a voltage divider, where the voltage divider comprises a filter formed by a resistor and a capacitor, and where the voltage divider generates a divided voltage signal representing the voltage measurment.

According to another aspect, a method for monitoring a voltage on a section of a computer chip comprises using a voltage divider to divide a voltage on the section, where the voltage divider comprises a resistor and a capacitor, and where the voltage divider generates a divided voltage signal that represents the voltage on the section.

According to another aspect, an integrated circuit having a voltage sensor that measures a voltage at a section of the integrated circuit, the voltage sensor comprises a divider stage disposed on the integrated circuit and having an RC filter configuration that selectively filters noise, where the divider stage divides the voltage to generate a divided voltage signal that represents the voltage at the section.

According to another aspect, a method for observing voltages at multiple sections of an integrated circuit comprises using a voltage sensor to measure a voltage at a section of the integrated circuit, using at least one other voltage sensor to measure at least one other voltage at least one other section of the integrated circuit, and selectively observing the voltage and the at least one other voltage from an observation point, where the observation point is operatively connected to an output of the voltage sensor and an output of the at least one other voltage sensor.

According to another aspect, a computer system comprises an integrated circuit, a voltage monitor disposed on a section of the integrated circuit, at least one other voltage monitor disposed on at least one other section of the integrated circuit, and an observation point operatively connected to an output of the voltage monitor and an output of the at least one other voltage monitor.

Other aspects and advantages of the invention will be apparent from the following description and the appended claims.

BRIEF DESCRIPTION OF DRAWINGS

FIG. 2 shows a relationship between voltage and time in accordance with the embodiment shown in FIG. 1a.

DETAILED DESCRIPTION

The present invention relates to an on-chip voltage sensor/monitor that determines an average power supply voltage at a section of a computer chip. The present invention also relates to a method for determining an average power supply voltage at a section of a computer chip.

Figure 1A:
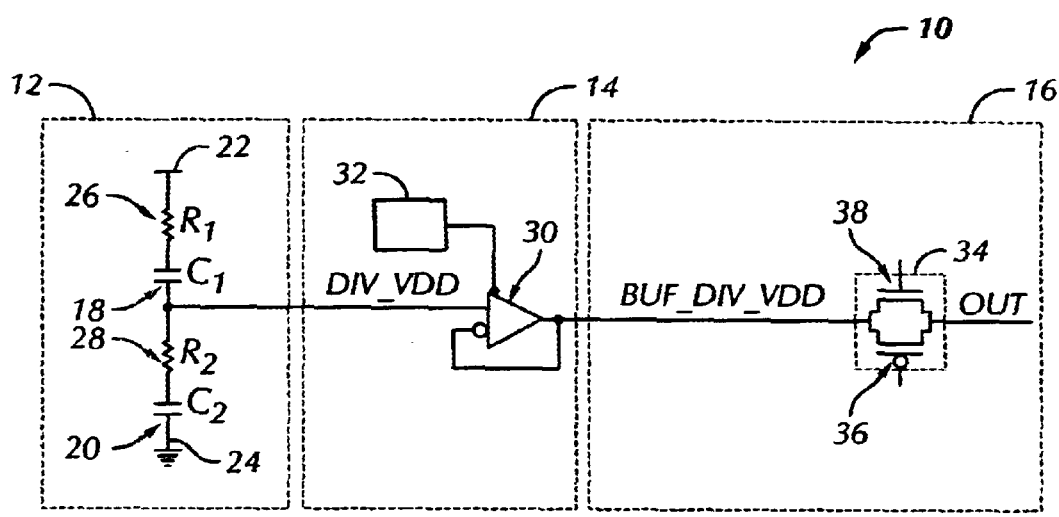
FIG. 1a shows a circuit schematic of a voltage sensor/monitor in accordance with an embodiment of the present invention.

FIG. 1a shows a circuit schematic of an on-chip voltage sensor/monitor (10) in accordance with an embodiment of the present invention. The on-chip voltage sensor/monitor (10) has a divider stage (12), buffer stage (14), and an output stage (16). The divider stage (12) is formed by a capacitive voltage divider configuration, which is formed by a first capacitor ($C_1$) (18) placed in series with a second capacitor ($C_2$) (20). These series connected capacitors (18, 20) are positioned between voltage supply ("VDD") (22) and ground (24) terminals. Further, a first resistor ($R_1$) (26) and second resistor ($R_2$) (28) are placed in series with the first and second capacitors (18, 20). The first and second capacitors (18, 20) and first and second resistors (26, 28) form a resistive-capacitive ("RC") configuration.

The divider stage (12), via the RC configuration, generates a divided voltage signal, DIV_VDD, where DIV_VDD=VDD($Z_2/(Z_1+Z_2)$), and where $Z_1 = R_1 C_1$ and $Z_2 = R_2 C_2$. Those skilled in the art will appreciate that the RC configuration within the divider stage (12) allows for filtration of certain frequencies by selecting and/or adjusting values for one or more of the resistors or capacitors. In other words, the resistors (26, 28) in the divider stage (12) may be tunable so as to allow voltage division to be cut off above a specific frequency, effectively eliminating performance-inhibiting high-frequency noise from the voltage division. Those skilled in the art will appreciate that the elimination of high-frequency noise in voltage monitoring may allow for more accurate voltage measurement.

DIV_VDD serves as an input to the buffer stage (14). The buffer stage (14) has an operational amplifier (30) that is configured in a unity-gain/voltage follower arrangement. A biasing circuit (32) is used to bias the operational amplifier (30). The output of the operational amplifier (30), BUF_DIV_VDD, serves as both negative feedback to the operational amplifier (30) and an input to the output stage (16).

The output stage (16) has a transmission gate (34), which is formed by a PMOS transistor (36) and NMOS transistor (38). Depending on signals from the voltage sensor's computer chip, the transmission gate (34) switches 'on' causing BUF_DIV_VDD to pass to an output, OUT, of the on-chip voltage sensor/monitor (10). Those skilled in the art will appreciate that the signal on OUT may be sent off-chip to indicate the voltage measurment.

One purpose of the buffer stage (14) is to buffer DIV_VDD so that it has drive strength. Another purpose of the buffer stage (14) is to isolate DIV_VDD from parasitic components resulting from an output bus connected to the voltage sensor/monitor (10).

Figure 1B:
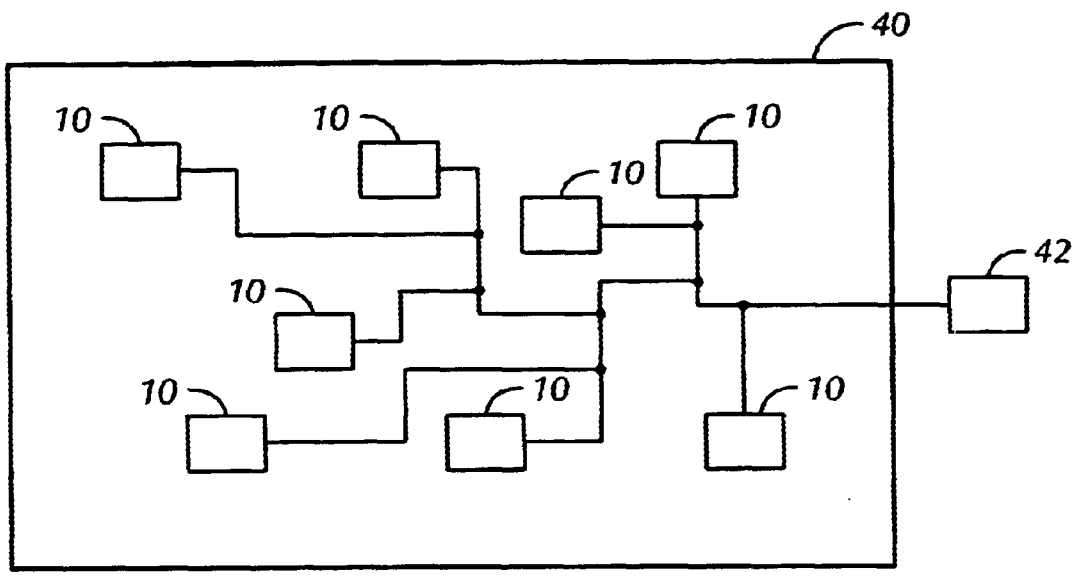
FIG. 1b shows an implementation in accordance with an embodiment of the present invention.

FIG. 1b shows an exemplary implementation in accordance with an embodiment of the present invention. Particularly, FIG. 1b shows an implementation where voltages at multiple locations on a computer chip can be measured using one output trace, i.e., wire. In other words, voltages at several points on a computer chip can be observed using one output pad. In FIG. 1b, multiple voltage sensors/monitors (10) (as configured in FIG. 1a) are positioned at points of interest on a computer chip (40). The voltage sensors/monitors (10) are connected to one observation point (42).

Those skilled in the art will appreciate that although the embodiment discussed above uses one observation point, other embodiments may use a different number, albeit a relatively small number, of observation points. Further, although the computer chip in FIG. 1b is shown as having a specific number of voltage sensors, any number of voltage sensors may be used.

Figure 2:
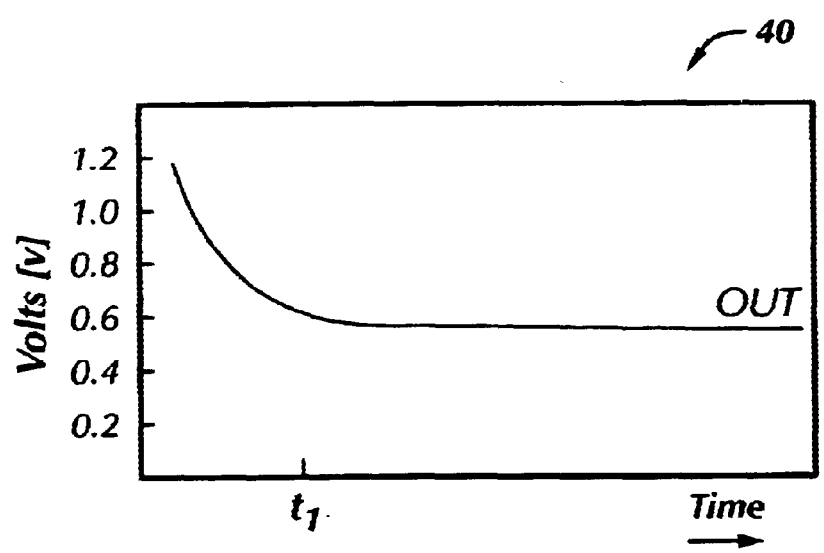

FIG. 2 shows an exemplary relationship (40) between voltage and time in accordance with the embodiment shown in FIG. 1. If the power supply voltage for the on-chip voltage sensor/monitor (10) shown in FIG. 1 is 1.2 volts, i.e., VDD=1.2V, the relationship (40) shows that OUT responds by going to ~0.6 volts after a finite period of time (shown in FIG. 2 as $t_1$). Those skilled in the art will appreciate that because of the relationship between time and voltage, the voltage sensor may be used to determine a voltage below a specific frequency on a section of a computer chip.

Advantages of the present invention may include one or more of the following. In some embodiments, because a voltage sensor may be used on-chip, a voltage at a section of a computer chip may be accurately determined.

In some embodiments, because voltages at multiple locations on a computer chip may be observed from one observation point, implementation cost and overhead is greatly reduced.

In some embodiments, because a voltage sensor uses a capacitive voltage divider, a chip designer may cut off voltage division above a particular frequency to eliminate high-frequency noise from a voltage measurement.

In some embodiments, because voltage at a section of a computer chip may be accurately determined with an on-chip voltage sensor, chip performance and efficiency may be increased.

In some embodiments, because voltage at a section of a computer chip may be determined, power grid integrity may be improved through design.

In some embodiments, because a capacitive voltage divider is used in a voltage sensor, noise frequencies above a selected level may be filtered out when the voltage sensor is used.

In some embodiments, because high frequencies may be rejected in an on-chip voltage measurement, average power supply voltage over a period of time may be determined.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A voltage monitor for monitoring voltage at a section of an integrated circuit, comprising:
   a divider stage disposed on the integrated circuit and comprising a voltage divider, wherein the voltage divider comprises a filter formed by a resistor and a capacitor connected in series, and wherein the voltage divider generates a divided voltage signal;
   a buffer stage comprising an operational amplifier that generates a buffered divided voltage signal based on the divided voltage signal; and
   an output stage disposed on the integrated circuit that selectively outputs a signal representative of the voltage at the section of the integrated circuit, wherein the signal representative of the voltage is based on the buffered divided voltage signal.

2. The voltage monitor of claim 1, wherein the resistor in the voltage divider is tunable, and wherein tuning the resistor filters noise from the voltage measurement.

3. A method for monitoring a voltage on a section of an integrated circuit, comprising:
   using a voltage divider disposed on the integrated circuit to divide a voltage on the section, wherein the voltage divider comprises a resistor and a capacitor connected in series, and wherein the voltage divider generates a divided voltage signal;
   buffering the divided voltage signal to generate a buffered divided voltage signal; and
   selectively outputting a signal representative of the voltage on the section of the integrated circuit, wherein the signal representative of the voltage is based on the buffered divided voltage signal.

4. The method of claim 3, wherein a value of the resistor is adjustable, the method further comprising:
   adjusting the value of the resistor in order to cut off voltage division above a desired frequency.

5. The method of claim 3, wherein the buffered divided voltage signal indicates the voltage on the section of the integrated circuit.

6. An integrated circuit having a voltage sensor that measures a voltage at a section of the integrated circuit, the voltage sensor comprising:
   a divider stage disposed on the integrated circuit and having an RC filter configuration that selectively filters noise, wherein the divider stage divides the voltage to generate a divided voltage signal that represents the voltage at the section, and wherein the RC filter comprises a resistor and capacitor connected in series;
   a buffer stage disposed on the integrated circuit that buffers the divided voltage signal to generate a buffered divided voltage signal; and
   an output stage disposed on the integrated circuit that selectively outputs the buffered divided voltage signal to an output of the on-chip voltage sensor.

7. The integrated circuit of claim 6, wherein a signal from the output of the voltage sensor is sent off-chip.

8. A method for observing voltages at multiple sections of an integrated circuit, comprising:

using a voltage sensor to measure a voltage at a section of the integrated circuit, wherein an output of the voltage sensor is operatively connected to an observation point, wherein using the voltage sensor to measure the voltage comprises:
  using a voltage divider disposed on the integrated circuit to divide a voltage on the section, wherein the voltage divider comprises a resistor and a capacitor connected in series, and wherein the voltage divider generates a divided voltage signal,
  buffering the divided voltage signal to generate a buffered divided voltage signal, and
  selectively outputting a signal representative of the voltage on the section of the integrated circuit, wherein the signal representative of the voltage is based on the buffered divided voltage signal;
using at least one other voltage sensor to measure at least one other voltage at least one other section of the integrated circuit, wherein an output of the at least one other voltage sensor is operatively connected to the observation point; and
selectively observing the voltage and the at least one other voltage from the observation point.

9. A computer system, comprising:
an integrated circuit;
a voltage monitor disposed on a section of the integrated circuit, wherein the voltage monitor comprises:
  a divider stage disposed on the integrated circuit and comprising a voltage divider, wherein the voltage divider comprises a filter formed by a resistor and a capacitor connected in series, and wherein the voltage divider generates a divided voltage signal,
  a buffer stage comprising an operational amplifier that generates a buffered divided voltage signal based on the divided voltage signal, wherein the signal representative of the voltage is based on the buffered divided voltage signal, and
  an output stage disposed on the integrated circuit that selectively outputs a signal representative of the voltage at the section of the integrated circuit;
at least one other voltage monitor disposed on at least one other section of the integrated circuit; and
an observation point operatively connected to an output of the voltage monitor and an output of the at least one other voltage monitor.

10. The computer system of claim 9, wherein the observation point is disposed on the integrated circuit.

11. The computer system of claim 9, wherein the observation point is disposed in an area of the computer system external to the integrated circuit.

* * * * *